(12) United States Patent
Kobayashi et al.

(10) Patent No.: US 7,439,625 B2
(45) Date of Patent: Oct. 21, 2008

(54) CIRCUIT BOARD

(75) Inventors: Hitoshi Kobayashi, Kyoto (JP);
Mitsunori Nagashima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 74 days.

(21) Appl. No.: 10/580,157

(22) PCT Filed: Nov. 19, 2004

(86) PCT No.: PCT/JP2004/017276

§ 371 (c)(1),
(2), (4) Date: May 19, 2006

(87) PCT Pub. No.: WO2005/051057

PCT Pub. Date: Jun. 2, 2005

(65) Prior Publication Data

US 2007/0108254 A1    May 17, 2007

(30) Foreign Application Priority Data

Nov. 21, 2003    (JP) .............................. 2003-392676

(51) Int. Cl.
*H01L 23/48* (2006.01)
(52) U.S. Cl. ...................... 257/773; 257/776
(58) Field of Classification Search ............... 428/209, 428/901; 174/250; 257/773, 776
See application file for complete search history.

(56) References Cited

U.S. PATENT DOCUMENTS 3,793,064 A * 2/1974 Budd et al. ............. 257/703
3,823,468 A * 7/1974 Hascoe ..................... 228/175
4,647,148 A * 3/1987 Katagiri ..................... 385/94
5,168,344 A * 12/1992 Ehlert et al. ............... 257/693
5,898,575 A * 4/1999 Hawthorne et al. ......... 361/809
6,175,086 B1   1/2001 Nakamura
6,262,513 B1 * 7/2001 Furukawa et al. ....... 310/313 R
6,281,449 B1 * 8/2001 Nakamura et al. ......... 174/261
6,351,194 B2 * 2/2002 Takahashi et al. .......... 333/133
6,700,061 B2 * 3/2004 Kishimoto .................. 174/377
6,734,781 B1 * 5/2004 Nagashima ................. 337/297
6,906,259 B2 * 6/2005 Hayashi ..................... 174/520
7,037,608 B2 * 5/2006 Nishimura et al. ............. 429/7
7,126,161 B2 * 10/2006 Yamazaki ................... 257/98
2003/0121142 A1   7/2003 Kikuchi et al.
2004/0266252 A1   12/2004 Sato

FOREIGN PATENT DOCUMENTS

| JP | 10-56257 | 2/1998 |
|---|---|---|
| JP | 10-209597 | 8/1998 |
| JP | 2002-50884 | 2/2002 |
| JP | 2002-144047 | 5/2002 |
| JP | 2002-208788 | 7/2002 |
| JP | 2003-168407 | 6/2003 |
| JP | 2004-304019 | 10/2004 |
| JP | 2004-348980 | 12/2004 |

* cited by examiner

*Primary Examiner*—Cathy Lam
(74) *Attorney, Agent, or Firm*—Hamre, Schumann, Mueller & Larson, P.C.

(57) ABSTRACT

A circuit board (A1) includes an insulative substrate (1), a conductive pad (4a) formed on the substrate, and a metal (3) bonded to the pad via a solder layer (6). The metal piece (3) has a welding portion (3a) to which an external-connection terminal (5) is welded. A gap (7) is provided between the welding portion (3a) and the substrate (1). The welding portion (3a) and the solder layer (6) are separated by the gap (7).

8 Claims, 6 Drawing Sheets

CIRCUIT BOARD

TECHNICAL FIELD

The present invention relates to a circuit board. The present invention specifically relates to a circuit board including an insulating base board and a metal member provided on the base board. The metal member is welded to a terminal for external connection.

BACKGROUND ART

FIG. 7 illustrates a conventional circuit board (refer to the following patent document 1). The illustrated circuit board X is used in e.g. battery pack for a mobile telephone. In this case, the circuit board X is provided with a protection circuit for preventing over discharge and overcharge of a rechargeable battery incorporated in the battery pack. As shown in the figure, the circuit board X includes an insulating base board 91 and a pair of rectangular metal plates 93 provided on the base board 91. The base board 91 is provided with a plurality of electronic components 92. Though not shown, a wiring pattern is formed on the base board 91 and connects the electronic components 92 and the metal plates 93 to each other.

As shown in FIG. 7, each of the metal plates 93 is welded to a conductive strip 95. Specifically, one end of the conductive strip 95 is welded to the metal plate 93, and the rest laterally protrudes beyond the base board 91. This protruding portion is bent into a predetermined form to be used as a connecting terminal relative to the rechargeable battery. As shown in FIG. 8, the welding process of the conductive strip 95 may be performed utilizing a welding device Y having two welding rods 97 (refer to the following patent document 2).

Patent Document 1: JP-A-2002-208788
Patent Document 2: JP-A-2002-144047

As shown in FIG. 9, the metal plate 93 is bonded to a pad 94a, which is a part of the wiring pattern, via a solder layer 96. The solder layer 96 covers entire under surface of the metal plate 93. Due to this structure, following problem occurs.

As shown in FIG. 9, in welding the conductive strip 95 to the metal plate 93, the welding rod 97 is pressed onto the conductive strip 95, so that the conductive strip 95 contacts the metal plate 93 intimately. In this state, an electric current is applied to the strip 95 and to the metal plate 93 through the welding rod 97. Due to heat caused by the electric current, the strip 95 is welded to the metal plate 93. This technique is commonly known as "resistance welding".

According to the conventional structure, the heat in welding tends to be transferred to the solder layer 96 via the metal plate 93, and may melt the solder layer 96. Further, depending on the welding condition (such as the amount of pressing force of the welding rod 97 or the amount of electric current to be applied), the melted solder may be scattered around the metal plate 93. If this scattered solder sticks to the electronic components 92, these components may not work normally, or may be damaged. To solve this problem, the electronic components 92 may be sealed by resin. However, if such structure is used, the number of manufacturing process or components is increased, and thus the product cost is increased.

DISCLOSURE OF THE INVENTION

The present invention has been proposed under the above-described circumstances. It is therefore an object of the present invention to provide a circuit board for properly preventing solder from scattering about in welding.

In order to achieve this object, the present invention employs technical means described below.

A circuit board according to the present invention comprises an insulating base board, a conductive pad provided on the base board, and a metal member bonded to the pad via a solder layer and including a welding portion to which a weldable object is welded. An air gap exists between the welding portion of the metal member and the base board, and the welding portion and the solder layer are spaced from each other via the air gap.

According to the structure, differently from the conventional art (where the solder layer is provided at entire under surface of the welding portion), the welding portion does not contact the solder layer due to the air gap. The air gap has an effect of preventing the heat, which is caused in welding the welding portion and the weldable object, from being transferred to the solder layer (heat insulation effect) Thus, the structure is capable of reducing the possibility that the solder layer melts due to the heat in welding, and thus is capable of preventing the melted solder layer from scattering around to stick to the peripheral electronic components. As a result, error or damage of the electronic components can be prevented. Further, as the electronic components do not require to be sealed by resin for protection, the number of manufacturing process or components is prevented from increasing, thereby preventing the product cost from increasing.

Preferably, the metal member is formed with a recess which serves as at least a part of the air gap.

Preferably, the metal member includes two ends folded back in a common direction, and a space between the ends serves as at least a part of the air gap.

Preferably, the metal member includes two ends and a central portion which is positioned higher than the ends, and a space between the two ends forms the recess.

Preferably, the recess is formed by etching the metal member.

Preferably, the metal member is a flat pipe having a hollow portion, and the hollow portion serves as the air gap.

Preferably, the solder layer is divided into a plurality of areas spaced from each other, and a space between the plurality of solder areas serves as at least a part of the air gap.

Preferably, the pad is divided into a plurality of parts each corresponding to respective one of the plurality of solder areas.

BEST MODE FOR CARRYING OUT THE INVENTION

Preferred embodiments of the present invention are specifically described below with reference to the accompanying drawings.

Figure 1:
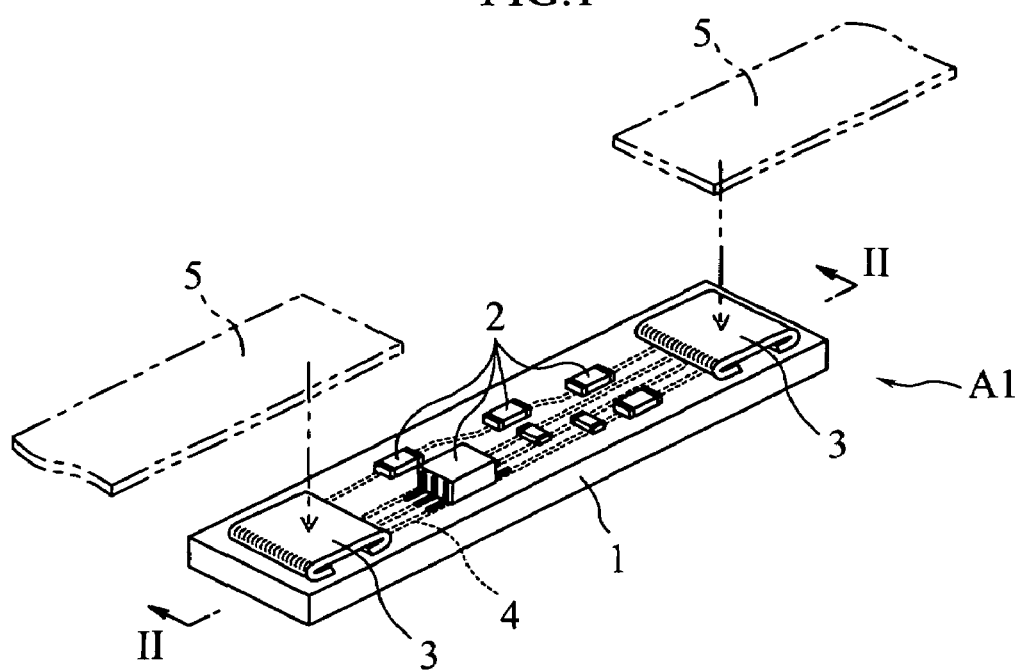
FIG. 1 is a perspective view illustrating a circuit board according to a first embodiment of the present invention.

FIG. 1 illustrates a circuit board according to a first embodiment of the present invention. The illustrated circuit board A1 is one of the units included in e.g. battery pack of a mobile telephone. Specifically, the circuit board A1 is provided with a protection circuit for preventing over discharge and overcharge of a rechargeable battery (not shown) incorporated in the battery pack. The circuit board A1 includes an insulating base board 1 and a pair of metal members 3. The base board 1 is provided with a plurality of electronic components 2.

The base board 1 is made of e.g. glass, epoxy resin, and takes the shape of an elongated rectangle in plane. The electronic components 2 provide the protection circuit. The upper surface of the baseboard 1 is formed with a wiring pattern 4.

Figure 2:
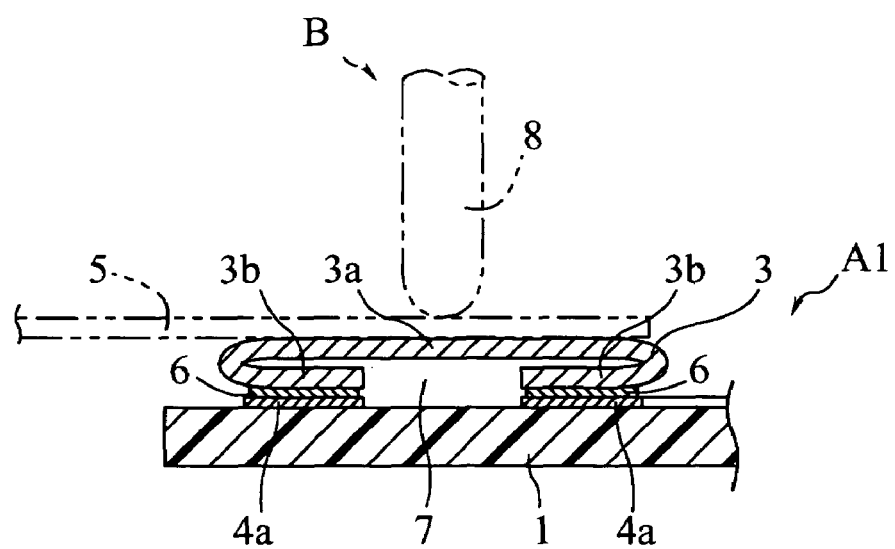
FIG. 2 is a sectional view illustrating a principal portion of the circuit board taken along lines II-II of FIG. 1.

Each of the metal members 3 made of e.g. nickel is rectangular. As described below, the upper surface of the metal member 3 is to be welded with a terminal 5. As shown in FIG. 2, the ends of the metal member 3 are folded back toward its lower surface to form a pair of folded portions 3b spaced from each other.

The metal member 3 is connected to a pair of pads 4a integrally formed at the wiring pattern 4, via a pair of solder layers 6. The pads 4a are spaced from each other and each of the pads 4a is bonded to a corresponding one of the folded portions 3b. The distance between the pads 4a is the same as, or similar to the di-stance between the folded portions 3. The central portion of the metal member 3 and the base plate 1 are spaced from each other through an air gap 7.

Next, technical advantages of the circuit board A1 is described below.

In use of the circuit board A1, the elongated rectangular terminal 5 is welded to the upper surface of the metal member 3. In this welding process, as shown in FIG. 2, the terminal 5 is pressed to the metal member 3 by a welding rod 8 of a welding device B. Specifically, the welding rod 8 presses a part of the terminal 5 (in contact with the welding rod 8) to a part of the metal member 3 (hereinafter referred to as "welding portion 3a"). In this state, by energizing through the welding rod 8, the metal member 3 and the terminal 5 are welded together. Through the welding process, as shown in the same figure, the terminal 5 is positioned to be partly protruding beyond the base board 1 in the lateral direction. This protruding portion is accordingly bent to form a terminal for connection -to the rechargeable battery.

In the above embodiment, the welding portion 3a does not directly contact the solder layers 6, so that the heat caused in welding is prevented from being transmitted to the solder layers 6. This structure reduces the possibility that the solder layers 6 melt in welding, and thus the melted solder is less likely to be scattered about. Therefore, the problem in the conventional art such as error or damage of the electronic components can be properly prevented.

Further in the above embodiment, the solder layers 6 are not provided right below the welding portion 3a (see FIG. 2). Thus, even if the metal member 3 is pressed by the welding rod 8 downwardly to be deformed, the welding portion 3a does not contact the solder layers 6. This structure is suitable to prevent the solder layers 6 from melting (and thus to prevent the melted solder from being scattered about). As the pads 4a are spaced from each other, the solder layers 6 can be easily spaced from each other. Suppose that, differently from the above structure, the metal member 3 is bonded to only one pad, following problem may be caused. For example, the metal 3 is fixed to a pad by reflow soldering. In this case, even if solder paste is applied to a plurality of divided areas spaced from each other on the pad, the solder paste melted in a heating process tends to be combined on the pad and to cover the entire upper surface of the pad. As a result, a solder layer is formed right below the welding portion 3a, and the above-described technical advantages cannot be obtained.

The metal member 3 can be made as follows. First, a rectangular metal plate elongated in one direction is prepared. Next, two side ends extending in the longitudinal direction of the metal plate are folded back toward its lower surface. Then, the metal plate is cut at predetermined intervals in the longitudinal direction (each of the cut lines extends in a direction perpendicular to the longitudinal direction of the metal plate). In this way, a plurality of metal members 3 can be made of one metal plate efficiently.

FIGS. 3-6 illustrate circuit boards according to other embodiments of the present invention. In the figures, elements identical or similar to those in the above first embodiment are given the same reference numbers.

Figure 3:
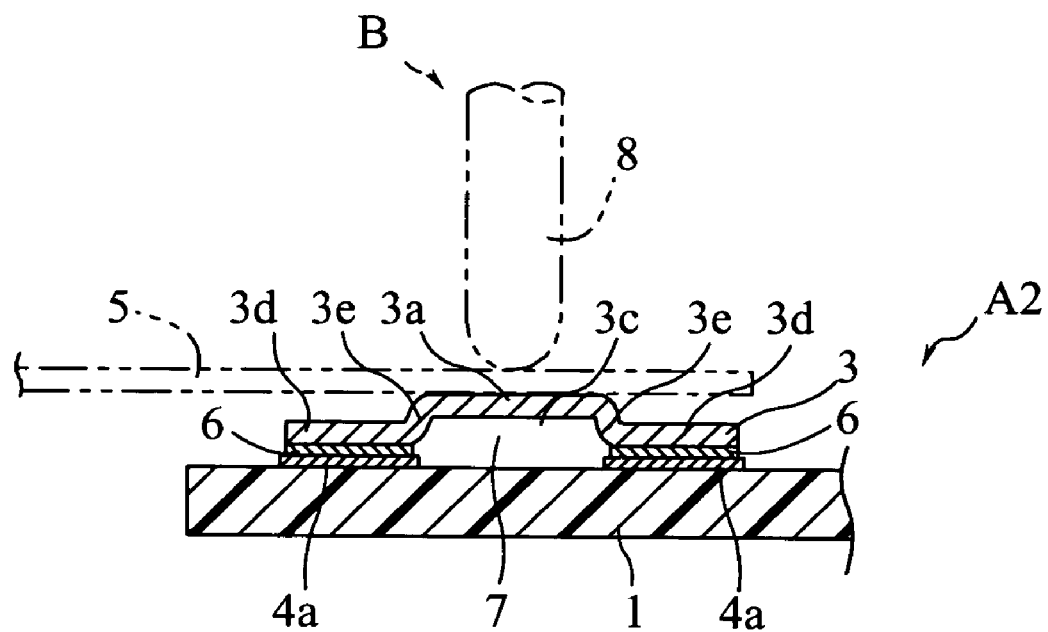
FIG. 3 is a sectional view illustrating a principal portion of the circuit board according to a second embodiment of the present invention.

FIG. 3 illustrates a circuit board A2 according to a second embodiment of the present invention. A metal member 3 of the circuit board A2 includes a flat central portion 3a and two flat ends 3d sandwiching the central portion. As shown in the figure, the metal member 3 is bent at predetermined portions so that the central portion 3a is positioned higher than the ends 3d. In other words, the metal member 3 includes a recess 3c formed between the ends 3d. The central portion 3a and the ends 3d are connected by connecting portions 3e.

In the second embodiment, similarly to the first embodiment, the central portion (welding portion) 3a is spaced from the base plate 1 through an air gap 7, and solder layers 6 are not provided right below the central portion 3a. This structure properly prevents the solder layers 6 from melting due to the heat in welding or from being scattered around. Such metal member 3 can be easily made by a pressing process utilizing a punch and a die. Further, a plurality of metal members 3 can be made of one elongated metal plate.

Figure 4:
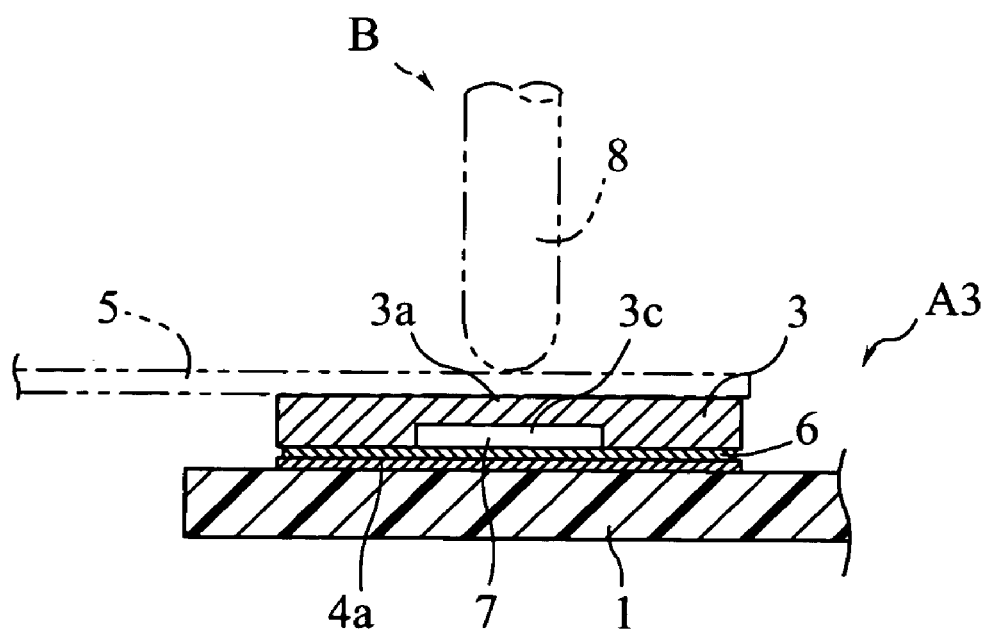
FIG. 4 is a sectional view illustrating a principal portion of the circuit board according to a third embodiment of the present invention.

FIG. 4 illustrates a circuit board A3 according to a third embodiment of the present invention. In the present embodiment, the bottom portion of the metal member 3 is partly removed through an etching process to form a recess 3c. Further in the present embodiment, the metal member 3 is bonded to one pad 4a via one solder solid layer 6. The solder solid layer 6 covers the entire upper surface of the pad 4a.

According to the third embodiment, the recess 3c can be formed into a proper form at a correct position through the etching process. Further, similarly to the above-described embodiments, the metal member 3 can be efficiently manufactured. Specifically, an elongated rectangular metal plate is etched to form a groove extending in the longitudinal direction of the metal plate. Thereafter, the metal member is cut at predetermined intervals in the longitudinal direction, thereby obtaining a plurality of metal members 3.

In the third embodiment, differently from the first and the second embodiments, the solder layer 6 is not divided into a plurality of separated parts. However, even in this structure, an air gap 7 exists between the welding portion 3a and the solder layer 6. Thus, the solder layer 6 can be prevented from unduly melting in the heat in welding.

Figure 5:
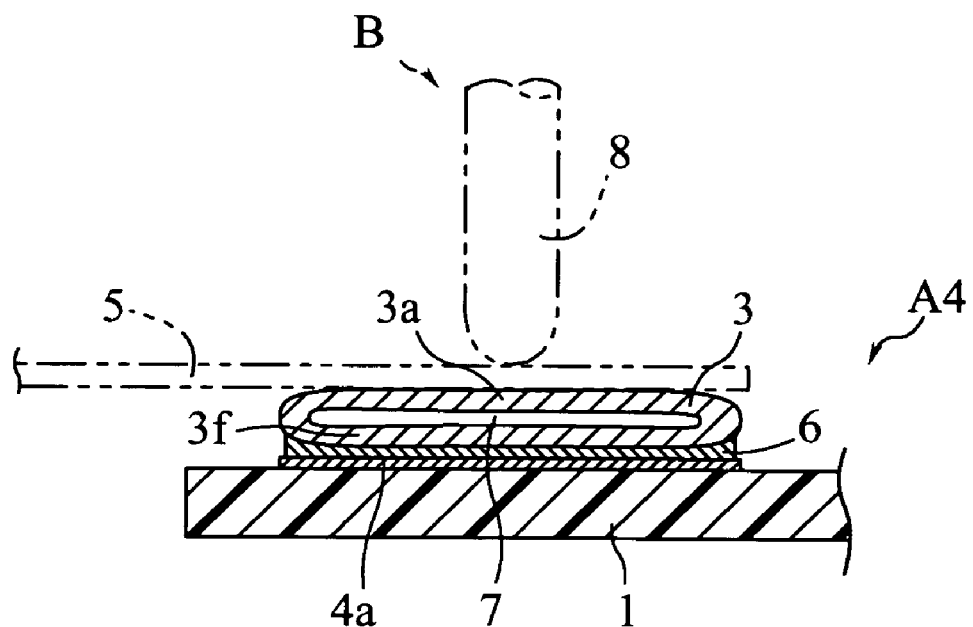
FIG. 5 is a sectional view illustrating a principal portion of the circuit board according to a fourth embodiment of the present invention.

FIG. 5 illustrates a circuit-board A4 according to a fourth embodiment of the present invention. The circuit board A4 includes a flat pipe-shaped metal member 3, and an air gap 7 exists at the hollow portion of the metal member 3. As shown in the figure, the upper portion of the metal member 3 serves as a welding portion 3a to be welded to a terminal 5, and the lower portion of the metal member 3 serves as a soldering portion 3f to be bonded to a pad 4a via a solder layer 6.

According to the fourth embodiment, the welding portion 3a and the soldering portion 3f have a substantially the same dimension as viewed in plane of the metal member 3. This structure enlarges the welding area of the terminal 5 and the metal member 3 as well as the bonding area of the metal member 3 and the pad 4a, thereby improving the bonding strength therebetween. Further, the air gap 7 can also be enlarged to a size substantially equal to the metal member 3 as viewed in plane, thereby improving the heat insulation effect against the heat in welding. The metal member 3 can be made by radially pressing and flattening a pipe having a proper length, and by cutting this pipe at predetermined intervals in the longitudinal direction.

Figure 6:
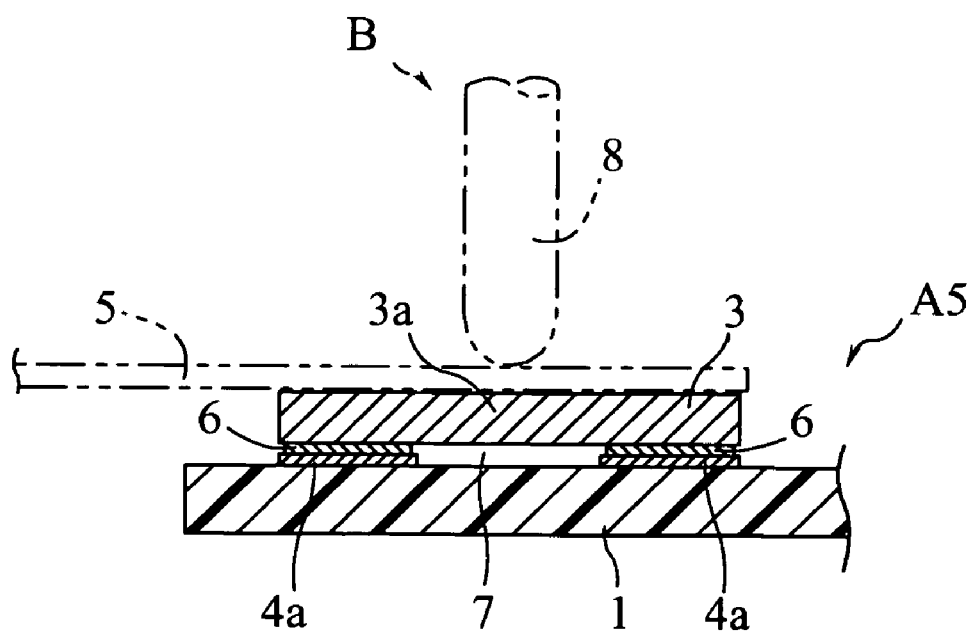
FIG. 6 is a sectional view illustrating a principal portion of the circuit board according to a fifth embodiment of the present invention.
Figure 7:
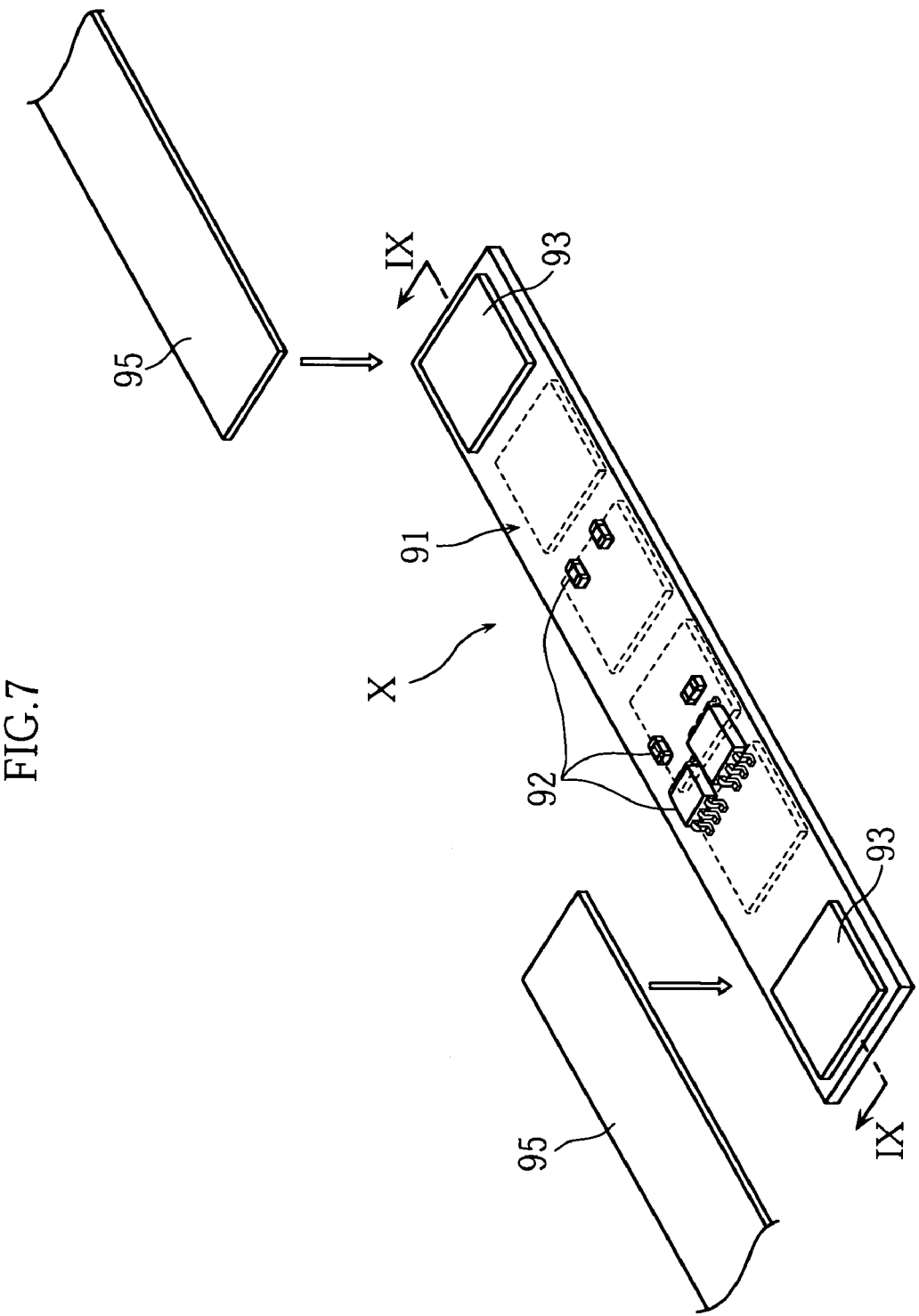
FIG. 7 is a perspective view illustrating a conventional circuit board.
Figure 8:
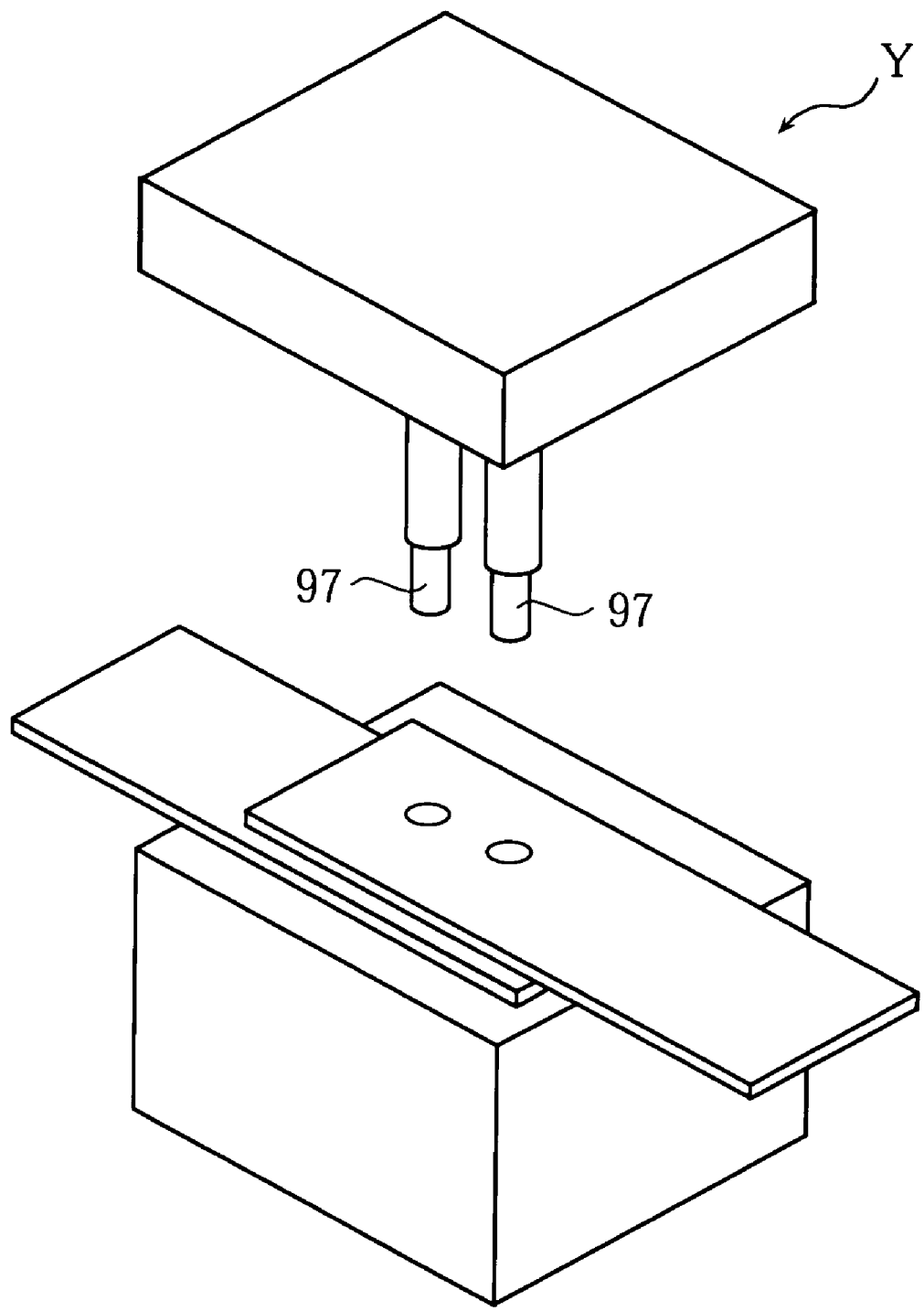
FIG. 8 is a perspective view illustrating an example of a welding device.
Figure 9:
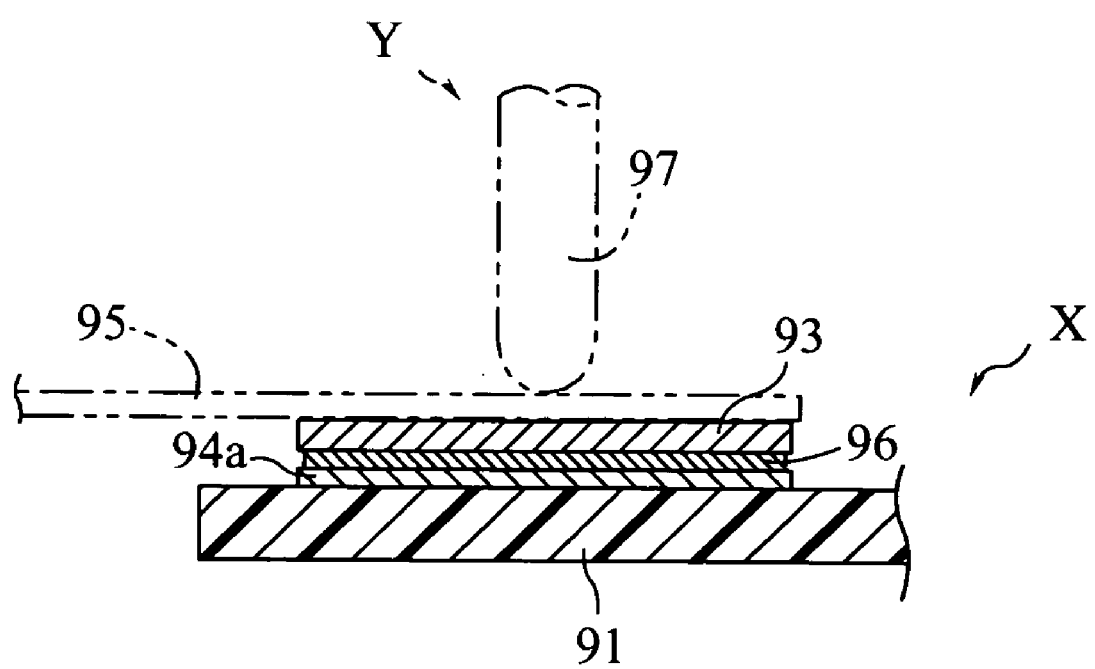
FIG. 9 is a sectional view illustrating a principal portion of the conventional circuit board taken along IX-IX lines of FIG. 7.

FIG. 6 illustrates a circuit board A5 according to a fifth embodiment of the present invention. The circuit board A5 includes a flat metal member 3 which is bonded to a pair of pads 4a via a pair of solder layers 6. Even with this metal member 3, an air gap 7 exists between a welding portion 3a and a base plate 1, so that the solder layers 6 are prevented from unduly melting in the heat in welding. Further, the metal member 3 shown in FIG. 6 can be easily manufactured as it requires no bending or etching process, thereby advantageously reducing the manufacturing cost.

The circuit board according to the present invention is not limited to the above-described embodiments, though may be modified in various ways.

For example, the recess formed at the metal member 3 is not limited to a groove extending in one direction, but may be a hole surrounded by walls. In providing the folded portions to the metal member, substantially entire circumference of the metal member may be folded back to surround the central portion of the metal member. Similar structure may be applied to the embodiment where the metal member is formed with a recess through the pressing or etching process.

The circuit board according to the present invention is not limited to be provided with a protection circuit of a battery pack. The member to be welded to the metal member is not limited to an elongated rectangular terminal, but may be a pin for electrical connection, for example.

The invention claimed is:

1. A circuit board comprising:
   an insulating base board;
   a conductive pad provided on the base board;
   a metal member bonded to the pad via a solder layer, the metal member including a welding portion; and
   a terminal welded to the welding portion of the metal member;
   wherein an air gap exists between the welding portion of the metal member and the base board, the welding portion and the solder layer being spaced from each other via the air gap.

2. The circuit board according to claim 1, wherein the metal member is formed with a recess which serves as at least a part of the air gap.

3. The circuit board according to claim 1, wherein the metal member includes two ends folded in a common direction, the ends outlining a space which serves as at least a part of the air gap.

4. The circuit board according to claim 2, wherein the metal member includes two ends and a central portion which is positioned higher than the ends, the two ends outlining a space which serves as the recess.

5. The circuit board according to claim 2, wherein the recess is formed by etching the metal member.

6. The circuit board according to claim 1, wherein the metal member is a flat pipe having a hollow portion, the hollow portion serving as the air gap.

7. The circuit board according to claim 1, wherein the solder layer is divided into a plurality of areas spaced from each other, the plurality of solder areas outlining a space which serves as at least a part of the air gap.

8. The circuit board according to claim 7, wherein the pad is divided into a plurality of parts each corresponding to respective one of the plurality of solder areas.

* * * * *